United States Patent
Tsai

(10) Patent No.: US 11,394,359 B2
(45) Date of Patent: *Jul. 19, 2022

(54) BAND STOP FILTER STRUCTURE AND METHOD OF FORMING

(71) Applicant: TAIWAN SEMICONDUCTOR MANUFACTURING COMPANY, LTD., Hsinchu (TW)

(72) Inventor: Ming Hsien Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/109,908

(22) Filed: Dec. 2, 2020

(65) Prior Publication Data
US 2021/0091743 A1 Mar. 25, 2021

Related U.S. Application Data

(63) Continuation of application No. 16/660,913, filed on Oct. 23, 2019, now Pat. No. 10,868,509, which is a
(Continued)

(51) Int. Cl.
*H03H 7/01* (2006.01)
*H01F 17/00* (2006.01)
(Continued)

(52) U.S. Cl.
CPC ......... *H03H 7/0115* (2013.01); *H01L 23/528* (2013.01); *H01L 23/5223* (2013.01);
(Continued)

(58) Field of Classification Search
CPC .... H01F 2017/0026; H03H 2001/0085; H03H 7/0115; H03H 7/09
(Continued)

(56) References Cited

U.S. PATENT DOCUMENTS 4,152,679 A 5/1979 Chen
6,762,654 B1 7/2004 Tanaka
(Continued)

FOREIGN PATENT DOCUMENTS

KR 10-2004-0025266 3/2004

OTHER PUBLICATIONS

Zhang, W., et al., "A Novel Broadband EBG Using Multi-Via Cascaded Mushroom-Like Structure," APMC2009, pp. 484-487.
(Continued)

*Primary Examiner* — Rakesh B Patel
(74) *Attorney, Agent, or Firm* — Hauptman Ham, LLP

(57) ABSTRACT

A filter structure includes a capacitive device and an inductive device. The capacitive device includes a ground plane in a first metal layer of an integrated circuit (IC) package, a plate in a second metal layer of the IC package, and a dielectric layer between the ground plane and the plate. The inductive device includes first and second conductive paths in a third metal layer of the IC package, each of the first and second conductive paths is electrically connected to the plate and has a width w, the first and second conductive paths are separated by a spacing s, and a ratio s/w has a value ranging from 1 to 2.

20 Claims, 12 Drawing Sheets

Related U.S. Application Data continuation of application No. 15/863,184, filed on Jan. 5, 2018, now Pat. No. 10,483,936.

(60) Provisional application No. 62/654,757, filed on Sep. 28, 2017.

(51) Int. Cl.
| | | |
|---|---|---|
| *H01L 49/02* | (2006.01) | |
| *H01L 23/00* | (2006.01) | |
| *H01L 23/528* | (2006.01) | |
| *H03H 7/09* | (2006.01) | |
| *H01L 23/522* | (2006.01) | |
| *H03H 1/00* | (2006.01) | |

(52) U.S. Cl.
CPC .......... *H01L 23/5227* (2013.01); *H01L 24/13* (2013.01); *H01L 24/14* (2013.01); *H01L 28/10* (2013.01); *H01L 28/40* (2013.01); *H03H 7/09* (2013.01); *H01F 2017/0026* (2013.01); *H01L 23/5286* (2013.01); *H01L 2224/13116* (2013.01); *H03H 2001/0078* (2013.01); *H03H 2001/0085* (2013.01); *H03H 2007/013* (2013.01)

(58) Field of Classification Search
USPC .......................................... 333/177; 336/200
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,256 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 10,483,936 B2 | 11/2019 | Tsai |
| 10,868,509 B2 * | 12/2020 | Tsai ..................... H01L 23/5223 |
| 2003/0137363 A1 * | 7/2003 | Bawell ..................... H03H 7/48 |
| | | 333/118 |
| 2007/0035363 A1 | 2/2007 | Kameya |
| 2013/0249652 A1 | 9/2013 | Pajovic |
| 2014/0203417 A1 | 7/2014 | Altunyurt |
| 2016/0072170 A1 | 3/2016 | Chen |
| 2016/0218092 A1 | 7/2016 | Chang |

OTHER PUBLICATIONS

Wu, T., et al., "A Novel Power Plane with Super-Wideband Elimination of Ground Bounce Noise on High Speed Circuits," IEEE MWCL2005, vol. 15, No. 3, pp. 174-176.

Office Action dated May 20, 2019 from corresponding application No. KR. 10-2018-0058557.

* cited by examiner

BAND STOP FILTER STRUCTURE AND METHOD OF FORMING

PRIORITY CLAIM

The present application is a continuation of U.S. application Ser. No. 16/660,913, filed Oct. 23, 2019, now U.S. Pat. No. 10,868,509, which is a continuation of U.S. application Ser. No. 15/863,184, filed Jan. 5, 2018, now U.S. Pat. No. 10,483,936, issued Nov. 19, 2019, which claims the priority of U.S. Provisional Application No. 62/564,757, filed Sep. 28, 2017, which are incorporated herein by reference in their entireties.

BACKGROUND

Integrated circuit (IC) packages are often used for applications in which power is distributed among one or more IC dies. Power is commonly routed to an IC die in an IC package through a post-passivation interconnect (PPI) structure that includes multiple redistribution layers (RDL).

As IC applications become increasingly complex and depend on increasing clock speeds and decreasing power supply voltages, sensitivity to noise such as simultaneous switching noise (SSN) and ground bounce noise (GBN) increases. Performance of filters used to suppress such noise is sometimes gauged by an S21 parameter, also referred to as a transmission coefficient, which indicates the amount of power transmitted by the filter at a given frequency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B are diagrams of band stop filter structures, in accordance with some embodiments.

DETAILED DESCRIPTION

Figure 1A:
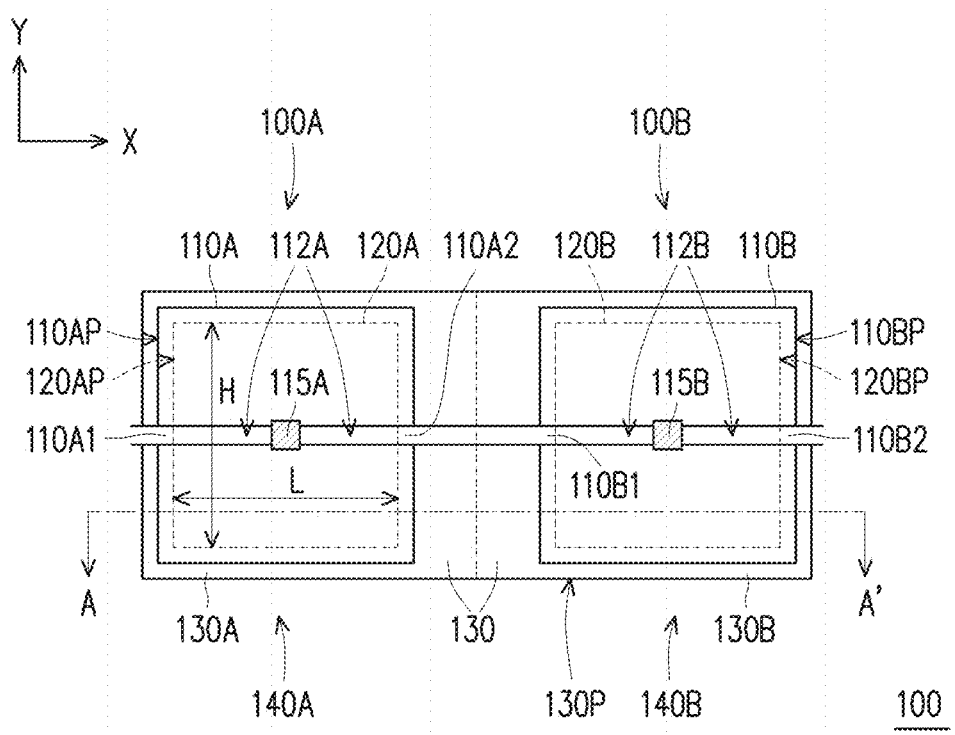
FIGS. 1A and 1B are diagrams of a band stop filter structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a band stop filter structure includes a ground plane in a first metal layer of an IC package, a plate in a second metal layer of the IC package, and a dielectric layer between the ground plane and the plate, thereby forming a capacitive device. An inductive device in a third metal layer of the IC package is electrically connected to the plate, and the resultant LC circuit functions to reduce a high frequency noise component of a signal transmitted from a first terminal of the filter structure to a second terminal of the filter structure. Compared to other approaches, e.g., printed circuit board (PCB) filters, the disclosed embodiments occupy less area and avoid additional processing steps that increase manufacturing costs.

Figure 1B:
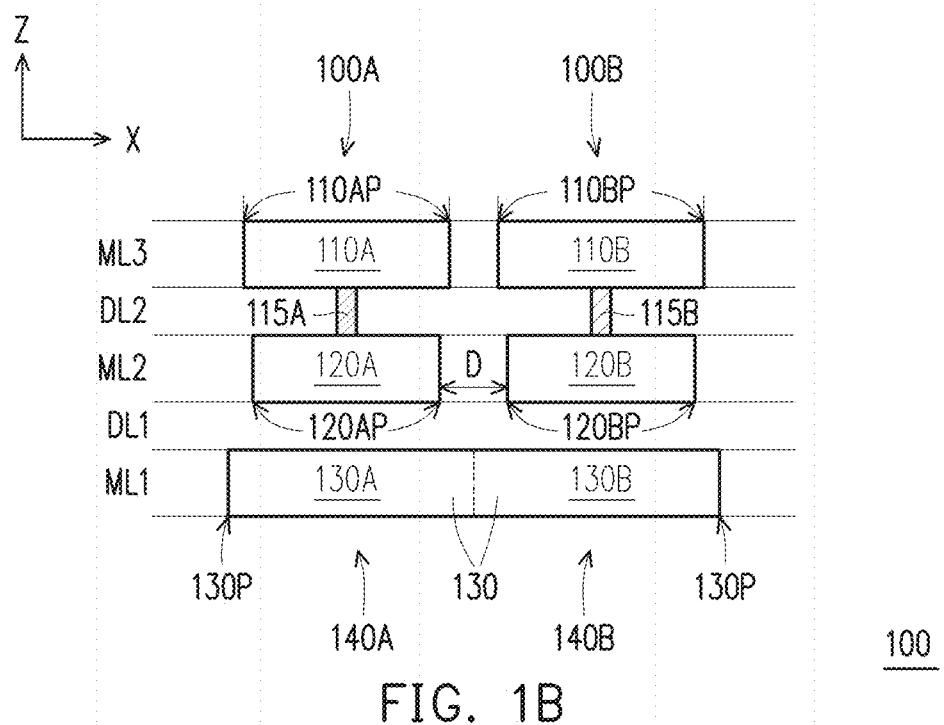

FIGS. 1A and 1B are diagrams of a band stop filter structure 100, in accordance with some embodiments. FIG. 1A is a diagram based on a plan view of band stop filter structure 100, and FIG. 1B is a diagram based on a cross-sectional view of band stop filter structure 100 along the plane indicated by line A-A' in FIG. 1A. In addition to band stop filter 100, FIG. 1A depicts directions X and Y, and FIG. 1B depicts directions X and Z.

Band stop filter structure 100 is a component of an IC package. In some embodiments, band stop filter structure 100 is part of a power distribution path among one or more of IC package dies, IC package interconnects, or IC package bump structures. In some embodiments, one or more band stop filter structures 100 are part of an IC package 200, discussed below with respect to FIG. 2.

In some embodiments, band stop filter structure 100 is a component of a 2.5D IC package. In some embodiments, band stop filter structure 100 is a component of a 3D IC package. In some embodiments, band stop filter structure 100 is a component of an integrated fan-out (InFO) package. In some embodiments, band stop filter structure 100 is one band stop filter structure of a plurality of band stop filter structures in an IC package.

Band stop filter structure 100 includes a unit cell 100A and a unit cell 100B. Unit cell 100A includes an inductive device 110A, a plate 120A, and a ground plane portion 130A. Inductive device 110A is positioned in a metal layer ML3 of the IC package, has a perimeter 110AP, overlies plate 120A, and is electrically connected to plate 120A by a via 115A through a dielectric layer DL2 of the IC package. Plate 120A is positioned in a metal layer ML2 of the IC package, has a perimeter 120AP, overlies ground plane portion 130A, and is electrically isolated from ground plane portion 130A by a dielectric layer DL1 of the IC package. Ground plane portion 130A is a portion of a ground plane 130 positioned in a metal layer ML1 of the IC package.

Plate 120A, ground plane portion 130A, and dielectric layer DL1 are thereby configured as a capacitive device 140A electrically connected to inductive device 110A through via 115A.

Unit cell 100B includes an inductive device 110B, a plate 120B, and a ground plane portion 130B. Inductive device 110B is positioned in metal layer ML3, has a perimeter 110B, overlies plate 120B, and is electrically connected to plate 120B by a via 115B through dielectric layer DL2. Plate 120B is positioned in metal layer ML2, has a perimeter 120B, overlies ground plane portion 130B, and is electrically isolated from ground plane portion 130B by dielectric layer DL1. Ground plane portion 130B is a portion of ground plane 130.

Plate 120B, ground plane portion 130B, and dielectric layer DL1 are thereby configured as a capacitive device 140B electrically connected to inductive device 110B through via 115B.

Each of metal layers ML1, ML2, and ML3 is a metal layer of an IC package. In some embodiments, each of metal layers ML1, ML2, and ML3 is a metal redistribution layer of an IC package. In some embodiments, one or more of metal layers ML1, ML2, or ML3 includes copper. In some embodiments, one or more of metal layers ML1, ML2, or ML3 includes a seed layer containing copper or a copper alloy. In some embodiments, one or more of metal layers ML1, ML2, or ML3 includes a diffusion barrier layer containing titanium.

In some embodiments, one or more of metal layers ML1, ML2, or ML3 has a thickness (not labeled) ranging from 3 μm to 20 μm. In some embodiments, one or more of metal layers ML1, ML2, or ML3 has a thickness ranging from 5 μm to 10 μm. One or more of metal layers ML1, ML2, or ML3 having a smaller thickness value reduces the ability of the one or more of metal layers ML1, ML2, or ML3 to provide desired electrical properties, e.g., conductivity, in some instances.

Each of dielectric layers DL1 and DL2 is an IC package layer including one or more materials capable of providing physical separation and high electrical resistance between one or more overlying package layers and one or more underlying package layers or an ambient environment. In some embodiments, one or both of dielectric layers DL1 and DL2 includes a polymer or another material suitable for physically and electrically isolating one or more overlying package layers. In some embodiments, one or both of dielectric layers DL1 and DL2 includes polybenzoxazole (PBO) or polyimide (PI).

In some embodiments, one or both of dielectric layers DL1 and DL2 has a thickness (not labeled) ranging from 2 micrometers (μm) to 20 μm. In some embodiments, one or both of dielectric layers DL1 and DL2 has a thickness ranging from 4 μm to 10 μm. One or both of dielectric layers DL1 and DL2 having a smaller thickness value reduces the ability of the one or both of dielectric layers DL1 and DL2 to provide physical and electrical isolation in some instances.

In some embodiments, one or both of dielectric layers DL1 and DL2 has a dielectric constant ranging from 2 to 5. In some embodiments, one or both of dielectric layers DL1 and DL2 has a dielectric constant ranging from 3 to 4.

Via 115A is a conductive structure in dielectric layer DL2 that overlies and contacts signal plate 120A, thereby being configured to provide an electrical connection between inductive device 110A and plate 120A. In some embodiments, via 115A includes a seed layer and/or a diffusion barrier layer. In some embodiments, via 115A includes one or more metals such as copper, a copper alloy, aluminum, tungsten, and/or titanium.

In some embodiments, via 115A has a thickness (not labeled) that matches the thickness of dielectric layer DL2. In some embodiments, unit cell 100A includes one or more layers (not shown) in addition to dielectric layer DL2 between inductive device 110A and plate 120A, and via 115A has a thickness greater than the thickness of dielectric layer DL2.

Inductive device 110A includes a terminal 110A1 and a terminal 110A2. In the embodiment depicted in FIGS. 1A and 1B, terminal 110A1 is a first terminal of inductive device 110A, terminal 110A2 is a second terminal of inductive device 110A, and via 115A is a third terminal of inductive device 110A so that inductive device 110A is a three-terminal inductive device. In some embodiments, via 115A is electrically connected to one of terminal 110A1 or terminal 110A2 so that inductive device 110A is a two-terminal inductive device.

In the embodiment depicted in FIGS. 1A and 1B, inductive device 110A comprises two paths 112A electrically connected at via 115A at a center of inductive device 110A, the two paths 112A configured to provide a predetermined inductance between terminal 110A1 and via 115A and between terminal 110A2 and via 115A. In some embodiments, inductive device 110A is inductive device 500, discussed below with respect to FIG. 5. In some embodiments, inductive device 110A comprises a configuration other than two paths 112A electrically connected at via 115A at a center of inductive device 110A.

In the embodiment depicted in FIGS. 1A and 1B, perimeter 110AP is aligned with perimeter 120AP in the Z direction so that substantially all of inductive device 110A overlies substantially all of plate 120A. In some embodiments, perimeter 110AP is not aligned with perimeter 120AP in the Z direction, and a portion or all of inductive device 110A overlies a portion of plate 120A. In some embodiments, perimeter 110AP is not aligned with perimeter 120AP in the Z direction, and a portion of inductive device 110A overlies a portion or all of plate 120A.

In the embodiment depicted in FIGS. 1A and 1B, perimeter 120AP is positioned along the inside of perimeter 110AP. In some embodiments, perimeter 120AP is positioned directly below perimeter 110AP. In some embodiments, a portion of perimeter 120AP is positioned outside of perimeter 110AP and a portion of perimeter 120AP is positioned inside of perimeter 110AP.

Ground plane 130 has a perimeter 130P. In the embodiment depicted in FIGS. 1A and 1B, each of perimeter 110AP and 120AP is positioned along the inside of a portion of perimeter 130P. In some embodiments, one or both of perimeter 110AP or perimeter 120AP is positioned directly above a portion of perimeter 130P. In some embodiments, one or both of perimeter 110AP or perimeter 120AP is positioned along the outside of a portion of perimeter 130P.

Plate 120A has a length L along the X direction and a height H along the Y direction. An effective capacitance of capacitive device 140A is determined in part by values of length L and height H, and by a ratio L/H of length L to height H.

In some embodiments, one or both of length L or height H has a value ranging from 100 micrometers (μm) to 1000

μm. In some embodiments, one or both of length L or height H has a value ranging from 300 μm to 600 μm.

In some embodiments, ratio L/H has a value ranging from 0.8 to 1.2. In some embodiments, ratio L/H has a value ranging from 0.9 to 1.1. In some embodiments, ratio L/H has a value approximately equal to 1.0.

In the embodiment depicted in FIGS. 1A and 1B, inductive device 110A, plate 120A, and ground plane portion 130A have a spatial relationship in which inductive device 110A, positioned in metal layer ML3, overlies plate 120A, positioned in metal layer ML2, and plate 120A overlies ground plane portion 130A, positioned in metal layer ML1. In some embodiments, one or more of inductive device 110A, plate 120A, or ground plane portion 130A is positioned in a layer other than metal layers ML3, ML2, or ML1, respectively, such that inductive device 110A, plate 120A, and ground plane portion 130A have a spatial relationship that differs from that depicted in FIGS. 1A and 1B.

In some embodiments, inductive device 110A, plate 120A, and ground plane portion 130A have an inverted spatial relationship corresponding to ground plane portion 130A being positioned in metal layer ML3, plate 120A being positioned in metal layer ML2, and inductive structure 110A being positioned in metal layer ML1. In some embodiments, inductive device 110A, plate 120A, and ground plane portion 130A have a spatial relationship corresponding to one of band stop filter structures 400A or 400B, discussed below with respect to FIGS. 4A and 4B.

The elements of unit cell 100B are composed and configured in the manner discussed above for the corresponding elements of unit cell 100A. In some embodiments, unit cells 100A and 100B have a same configuration. In some embodiments, unit cells 100A and 100B have configurations that differ from each other.

In the embodiment depicted in FIGS. 1A and 1B, band stop filter structure 100 includes two unit cells, unit cells 100A and 100B. In some embodiments, band stop filter structure 100 includes a single unit cell, and ground plane 130 includes only one of ground plane portions 130A or 130B. In some embodiments, band stop filter structure 100 includes greater than two unit cells and ground plane 130 includes one or more ground plane portions (not shown) in addition to ground plane portions 130A and 130B.

In the embodiment depicted in FIGS. 1A and 1B, band stop filter structure 100 includes unit cells 100A and 100B configured as a 1×2 array of unit cells, i.e., one row and two columns. In some embodiments, band stop filter structure 100 includes unit cells 100A and 100B as part of an array of unit cells having more than two unit cells. In some embodiments, a unit cell, e.g., unit cell 100A, is one unit cell of an array of unit cells 100A included in a band stop filter structure such as one of band stop filter structures 300A-300D, discussed below with respect to FIGS. 3A-3D.

Plates 120A and 120B are separated by a distance D along the X direction. A capacitive coupling between capacitive devices 140A and 140B is determined in part by a value of distance D. In some embodiments, distance D is a minimum value of a manufacturing rule for metal layer ML2, in which each of plates 120A and 120B is positioned.

In some embodiments, distance D has a value ranging from 10 μm to 100 μm. In some embodiments, distance D has a value ranging from 20 μm to 50 μm. Distance D having larger values increases the area occupied by band stop filter structure 100 in some instances.

In the embodiment depicted in FIGS. 1A and 1B, via 115A is positioned at a center of unit cell 100A, and via 115B is positioned at a center of unit cell 100B. In some embodiments, one or both of vias 115A or 115B is positioned at another location within the corresponding unit cell 100A or 100B.

Inductive device 110B includes a terminal 110B1 and a terminal 110B2. Terminal 110A2 is electrically connected to terminal 110B1. In the embodiment depicted in FIGS. 1A and 1B, the entirety of inductive devices 110A and 110B, including each of terminals 110A1, 110A2, 110B1, and 110B2, is positioned in metal layer ML3. In some embodiments, substantially all of inductive devices 110A and 110B is positioned in metal layer ML3, and some or all of terminals 110A1, 110A2, 110B1, or 110B2 is positioned in one or more metal layers (not shown) other than metal layer ML3.

In some embodiments, band stop filter structure 100, in operation, receives a signal at terminal 110A1, the signal comprising a power component and a noise component. In some embodiments, the power component is substantially a direct current (DC) signal and is propagated through inductive device 110A from terminal 110A1 to terminal 110A2, and through inductive device 110B from terminal 110B1 to terminal 110B2. In some embodiments, the power component is substantially a low frequency alternating current (AC) signal and is propagated through inductive device 110A from terminal 110A1 to terminal 110A2, and through inductive device 110B from terminal 110B1 to terminal 110B2.

The noise component is substantially an AC signal including one or more high frequencies, e.g., a radio frequency (RF) and/or a microwave frequency. In some embodiments, the noise component includes one or more frequencies above 1 gigahertz (GHz). By the configuration depicted in FIGS. 1A and 1B, inductive device 110A and capacitive device 140A have a frequency response that, in operation, prevents a portion of the noise component from propagating from terminal 110A1 to terminal 110A2 and instead causes the portion of the noise component to propagate through inductive device 110A and capacitive device 140A to ground plane 130.

By the configuration depicted in FIGS. 1A and 1B, inductive device 110B and capacitive device 140B have a frequency response that, in operation, prevents a further portion of the noise component from propagating from terminal 110B1 to terminal 110B2 and instead causes the further portion of the noise component to propagate through inductive device 110B and capacitive device 140B to ground plane 130.

By the configurations discussed above, band stop filter structure 100, compared to other noise filtering approaches, e.g., PCB filters, occupies less area and is capable of being formed without relying on additional processing steps that increase manufacturing costs.

Figure 2:
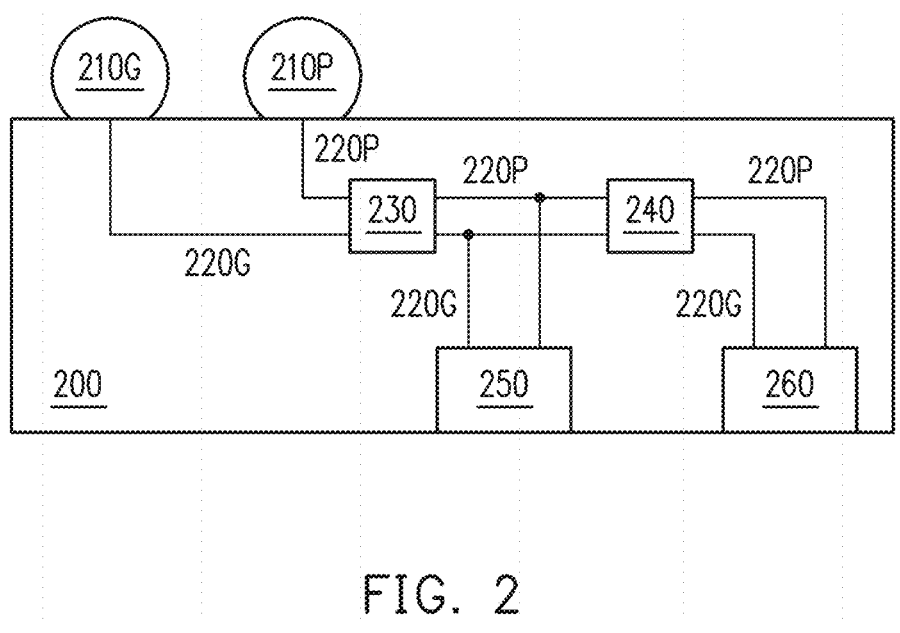
FIG. 2 is a diagram of a cross-sectional view of an IC package, in accordance with some embodiments.

FIG. 2 is a diagram of a cross-sectional view of an IC package 200, in accordance with some embodiments. IC package 200 includes bump structures 210P and 210G, power distribution paths 220P and 220G, band stop filter structures 230 and 240, and IC dies 250 and 260. Band stop filter structure 100, discussed above with respect to FIG. 1, is usable as one or both of band stop filters 230 or 240.

Power distribution path 220P is configured to provide an electrical connection from bump structure 210P to each of IC dies 250 and 260, and power distribution path 220G is configured to provide a ground connection between bump structure 210G and each of IC dies 250 and 260.

Band stop filter structure 230 is part of power distribution path 220P between bump structure 210P and IC die 250, and part of power distribution path 220G between bump structure 210G and IC die 250. In some embodiments, band stop filter structure 100, discussed above with respect to FIGS. 1A and 1B, is used as band stop filter structure 230, one or both of inductive devices 110A or 110B is part of power distribution path 220P, and ground plane 130 is part of power distribution path 220G.

Band stop filter structure 240 is part of power distribution path 220P between IC die 250 and IC die 260, and part of power distribution path 220G between IC die 250 and IC die 260. In some embodiments, band stop filter structure 100, discussed above with respect to FIGS. 1A and 1B, is used as band stop filter structure 240, one or both of inductive devices 110A or 110B is part of power distribution path 220P, and ground plane 130 is part of power distribution path 220G.

Bump structures 210P and 210G are conductive structures that overlie and contact portions of power distribution paths 220P and 220G, respectively, thereby being configured to provide electrical connections between power distribution paths 220P and 220G and corresponding external conductive elements (not shown). In some embodiments, bump structures 210P and 210G include lead. In some embodiments, bump structures 210P and 210G include lead-free materials such as tin, nickel, gold, silver, copper, or other materials suitable for providing electrical connections to external conductive elements.

In some embodiments, bump structures 210P and 210G have substantially spherical shapes. In some embodiments, bump structures 210P and 210G are controlled collapse chip connection (C4) bumps, ball grid array bumps, microbumps or the like.

Power distribution paths 220P and 220G are conductive structures in IC package 200. In some embodiments, power distribution paths 220P and 220G are part of a PPI structure in IC package 200. In some embodiments, power distribution paths 220P and 220G are part of a power distribution network within IC package 200. In some embodiments, IC package 200 is one IC package in a plurality of IC packages, and power distribution paths 220P and 220G are part of a power distribution network within the plurality of IC packages.

Power distribution paths 220P and 220G include conductive and dielectric elements composed and configured in the manner of metal layers ML1, ML2, and ML3, dielectric layers DL1 and DL2, and vias 115A and 115B, discussed above with respect to band stop filter structure 100 and FIGS. 1A and 1B.

By including one or more band stop filter structures 100, IC package 200, compared to other approaches, e.g., IC packages including PCB filters, is capable of filtering noise using one or more filters that occupies less area and is capable of being formed without relying on additional processing steps that increase manufacturing costs.

FIGS. 3A-3D are diagrams of band stop filter structures 300A-300D, in accordance with some embodiments. Each of band stop filter structures 300A-300D includes an array of unit cells 100A, discussed above with respect to band stop filter structure 100 and FIGS. 1A and 1B.

Figure 3A:
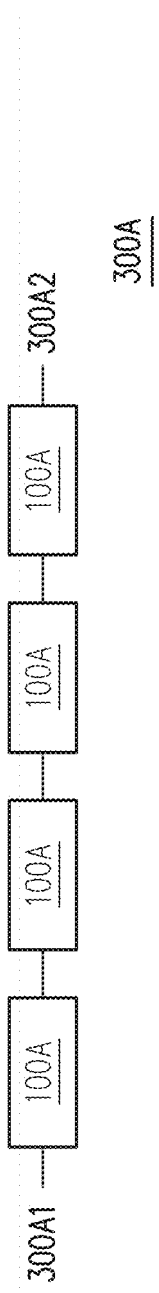
FIGS. 3A-3D are diagrams of band stop filter structures, in accordance with some embodiments.

As depicted in FIG. 3A, band stop filter structure 300A includes a 1×4 array of unit cells 100A, a terminal 300A1, and a terminal 300A2. Between terminals 300A1 and 300A2, each of four unit cells 100A in a single row is electrically connected to an adjacent unit cell 100A by a shared terminal (not labeled).

In the manner discussed above with respect to band stop filter structure 100 and FIGS. 1A and 1B, band stop filter structure 300A is thereby configured to, in operation, receive a signal at terminal 300A1, propagate a power component of the signal through inductive devices 110A to terminal 300A2, prevent a portion of a noise component of the signal from propagating from terminal 300A1 to terminal 300A2, and instead cause the portion of the noise component to propagate through inductive devices 110A and capacitive devices 140A to ground plane 130.

By including four unit cells 100A, band stop filter structure 300A is capable of propagating a larger portion of the noise component to ground in comparison to embodiments that include fewer than four unit cells, e.g., band stop filter structure 100 including unit cells 100A and 100B.

Figure 3B:
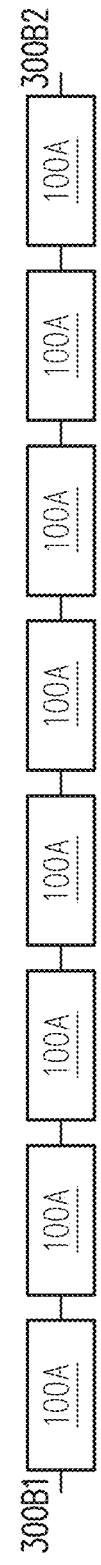

As depicted in FIG. 3B, band stop filter structure 300B includes a 1×8 array of unit cells 100A, a terminal 300B1, and a terminal 300B2. Between terminals 300B1 and 300B2, each of eight unit cells 100A in a single row is electrically connected to an adjacent unit cell 100A by a shared terminal (not labeled).

In the manner discussed above with respect to band stop filter structure 100 and FIGS. 1A and 1B, band stop filter structure 300B is thereby configured to, in operation, receive a signal at terminal 300B1, propagate a power component of the signal through inductive devices 110A to terminal 300B2, prevent a portion of a noise component of the signal from propagating from terminal 300B1 to terminal 300B2, and instead cause the portion of the noise component to propagate through inductive devices 110A and capacitive devices 140A to ground plane 130.

By including eight unit cells 100A, band stop filter structure 300B is capable of propagating a larger portion of the noise component to ground in comparison to embodiments that include fewer than eight unit cells, e.g., band stop filter structure 100 including unit cells 100A and 100B.

Figure 3C:
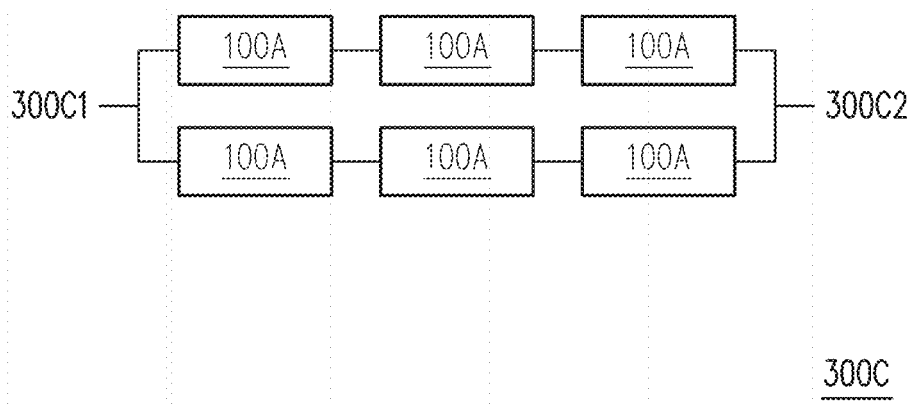

As depicted in FIG. 3C, band stop filter structure 300C includes a 2×3 array of unit cells 100A, a terminal 300C1, and a terminal 300C2. Between terminals 300C1 and 300C2, each of three unit cells 100A in each of two rows is electrically connected to an adjacent unit cell 100A by a shared terminal (not labeled).

In the manner discussed above with respect to band stop filter structure 100 and FIGS. 1A and 1B, band stop filter structure 300C is thereby configured to, in operation, receive a signal at terminal 300C1, propagate a power component of the signal through inductive devices 110A to terminal 300C2, prevent a portion of a noise component of the signal from propagating from terminal 300C1 to terminal 300C2, and instead cause the portion of the noise component to propagate through inductive devices 110A and capacitive devices 140A to ground plane 130.

By including six unit cells 100A, band stop filter structure 300C is capable of propagating a larger portion of the noise component to ground in comparison to embodiments that include fewer than six unit cells, e.g., band stop filter structure 100 including unit cells 100A and 100B.

Figure 3D:
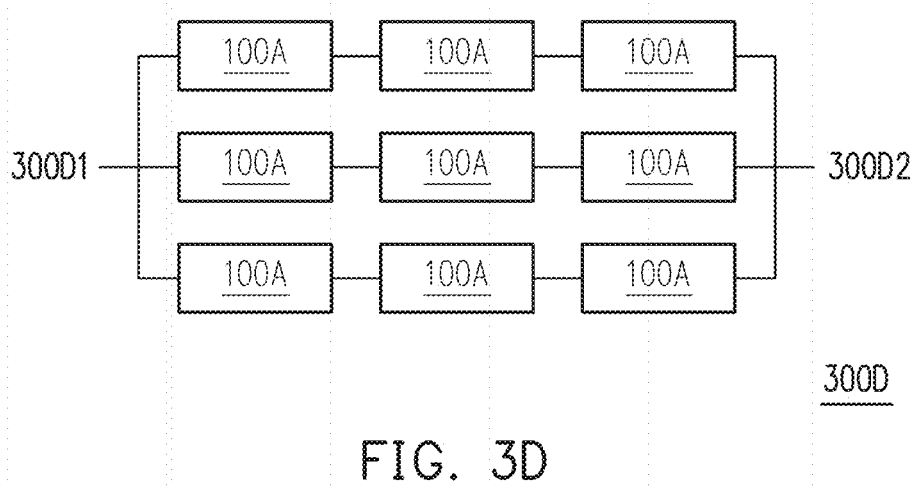

As depicted in FIG. 3D, band stop filter structure 300D includes a 3×3 array of unit cells 100A, a terminal 300D1, and a terminal 300D2. Between terminals 300D1 and 300D2, each of three unit cells 100A in each of three rows is electrically connected to an adjacent unit cell 100A by a shared terminal (not labeled).

In the manner discussed above with respect to band stop filter structure 100 and FIGS. 1A and 1B, band stop filter structure 300D is thereby configured to, in operation, receive a signal at terminal 300D1, propagate a power component of the signal through inductive devices 110A to terminal 300D2, prevent a portion of a noise component of the signal from propagating from terminal 300D1 to terminal 300D2, and instead cause the portion of the noise component to propagate through inductive devices 110A and capacitive devices 140A to ground plane 130.

By including nine unit cells 100A, band stop filter structure 300C is capable of propagating a larger portion of the noise component to ground in comparison to embodiments that include fewer than nine unit cells, e.g., band stop filter structure 100 including unit cells 100A and 100B.

By the configurations discussed above, each of band stop filter structures 300A-300D, compared to other noise filtering approaches, e.g., PCB filters, occupies less area and is capable of being formed without relying on additional processing steps that increase manufacturing costs.

Figure 4A:
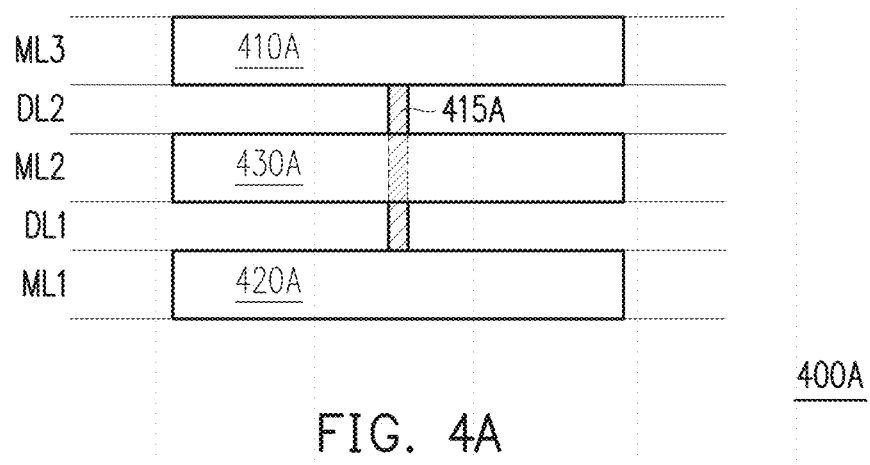

FIGS. 4A and 4B are diagrams of band stop filter structures 400A and 4B, in accordance with some embodiments. Each of band stop filter structures 400A and 400B includes features corresponding to inductive device 110A, via 115A, plate 120A, and ground plane portion 130A, discussed above with respect to unit cell 100A of band stop filter structure 100 and FIGS. 1A and 1B.

Band stop filter structure 400A (FIG. 4A) includes an inductive device 410A, a conductive element 415A, a plate 420A, and a ground plane portion 430A. Inductive device 410A is positioned in metal layer ML3 and overlies ground plane portion 430A, positioned in metal layer ML2, and ground plane portion 430A overlies plate 420A, positioned in metal layer ML1.

Conductive element 415A extends from inductive device 410A to plate 420A, thereby providing an electrical connection between inductive device 410A and plate 420A. In some embodiments, conductive element 415A extends through an opening in ground plane 430A. In some embodiments, conductive element 415A extends outside a perimeter of ground plane 430A.

Ground plane 430A, dielectric layer DL1, and plate 420A are thereby configured as a capacitive device (not labeled) electrically connected to inductive device 410A through conductive element 415A, and band stop filter structure 400A is thereby configured as a unit cell having the properties discussed above with respect to unit cell 100A of band stop filter structure 100 and FIGS. 1A and 1B.

In some embodiments, the configuration of band stop filter structure 400A causes band stop filter structure 400A to have properties that differ from those of band stop filter structure 100 having similar dimensions. For example, in some embodiments, conductive element 415A having a length greater than a length of via 115A reduces an amount of coupling between inductive device 410A and the capacitive device formed by ground plane 430A, dielectric layer DL1, and plate 420A, as compared to an amount of coupling between inductive device 110A and capacitive device 140A.

Band stop filter structure 400B (depicted in FIG. 4B) includes inductive devices 410B1 and 410B2, conductive elements 415B1 and 415B2, plates 420B1 and 420B2, and a ground plane portion 430B. Inductive device 410B1 is positioned in a metal layer ML5 and overlies plate 420B1, positioned in a metal layer ML4, and plate 420B1 overlies ground plane portion 430B, positioned in metal layer ML3. A dielectric layer DL4 is positioned between metal layers ML5 and ML4, and a dielectric layer DL3 is positioned between metal layers ML4 and ML3.

Conductive element 415B1 extends from inductive device 410B1 to plate 420B1 through dielectric layer DL4, thereby providing an electrical connection between inductive device 410B1 and plate 420B1. Plate 420B1, dielectric layer DL3, and ground plane portion 430B are configured as a capacitive device (not labeled) electrically connected to inductive device 410B1 through conductive element 415B1.

Ground plane portion 430B overlies plate 420B2, positioned in metal layer ML2, and plate 420B2 overlies inductive device 410B2, positioned in metal layer ML1. Ground plane 430B, dielectric layer DL2, and plate 420B2 are thereby configured as a capacitive device (not labeled). Conductive element 415B2 extends from plate 420B2 to inductive device 410B2 through dielectric layer DL1, thereby providing an electrical connection between plate 420B2 and inductive device 410B2.

Band stop filter structure 400B is thereby configured as a first unit cell including inductive device 410B1, conductive element 415B1, plate 420B1, and ground plane portion 430B, and a second unit cell including inductive device 410B2, conductive element 415B2, plate 420B2, and ground plane portion 430B, each unit cell having the properties discussed above with respect to unit cell 100A of band stop filter structure 100 and FIGS. 1A and 1B.

In some embodiments, band stop filter 400B includes one or more conductive elements (not shown) configured to provide an electrical connection between inductive devices 410B1 and 410B2.

In some embodiments, band stop filter 400B band stop filter 400B includes one or more conductive elements configured to provide an electrical connection between inductive devices 410B1 and 410B2, and does not include one of plates 420B1 or 420B2, so that band stop filter 400B is configured as a single unit cell including inductive devices 410B1 and 410B2 as a single, combined inductive device.

In some embodiments, the configuration of band stop filter structure 400B causes band stop filter structure 400B to have properties that differ from those of band stop filter structure 100 having similar dimensions. For example, in some embodiments, dielectric layer DL3 having a thickness larger than a thickness of dielectric layer DL1 reduces a capacitance value of the capacitive device formed by plate 420B1, dielectric layer DL3, and ground plane portion 430B, as compared to a capacitance value of capacitive device 140A.

By the configurations discussed above, each of band stop filter structures 400A and 400B, compared to other noise filtering approaches, e.g., PCB filters, occupies less area and is capable of being formed without relying on additional processing steps that increase manufacturing costs.

Figure 5:
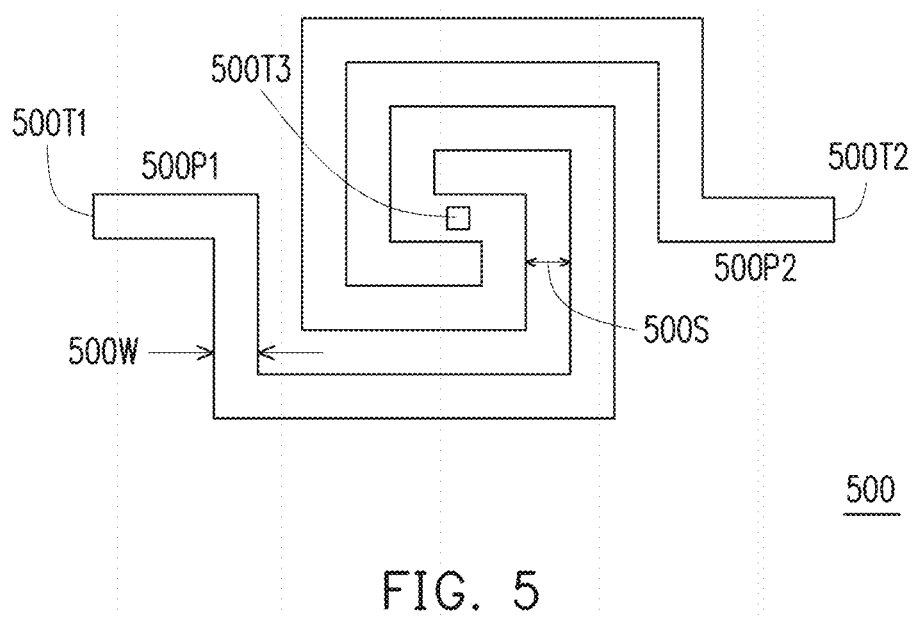
FIG. 5 is a diagram of an inductive device, in accordance with some embodiments.

FIG. 5 a diagram of an inductive device 500, in accordance with some embodiments. Inductive device 500 is usable as any of inductive devices 110A or 110B, discussed above with respect to band stop filter structure 100 and FIGS. 1A and 1B, inductive device 410A, discussed above with respect to FIG. 4A, or inductive devices 410B1 or 410B2, discussed above with respect to FIG. 4B.

Inductive device 500 comprises two rotationally symmetrical spiral paths, path 500P1 and path 500P2. Path 500P1 is an electrically conductive path extending from a terminal 500T1 to a terminal 500T3 positioned at the center of inductive device 500. Path 500P2 is an electrically conductive path extending from a terminal 500T2 to terminal 500T3. Paths 500P1 and 500P2 are thereby configured to provide a predetermined inductance between corresponding terminals 500T1 and 500T3, and terminals 500T2 and 500T3.

In the embodiment depicted in FIG. 5, each of paths 500P1 and 500P2 has three vertical segments and four horizontal segments. In some embodiments, each of paths 500P1 and 500P2 has fewer than three vertical segments and/or fewer than four horizontal segments. In some embodiments, each of paths 500P1 and 500P2 has greater than three vertical segments and/or greater than four horizontal segments.

Each of paths 500P1 and 500P2 has a width 500W, and paths 500P1 and 500P2 are separated by a distance 500S. An effective inductance of inductive device 500 is determined in part by a value of a ratio 500S/500W.

In some embodiments, ratio 500S/500W has a value ranging from 1 to 2. In some embodiments, ratio 500S/500W has a value ranging from 1.5 to 1.7. In some embodiments, ratio 500S/500W has a value approximately equal to 1.6.

By including inductive device 500, a band stop filter structure, compared to other noise filtering approaches, e.g., PCB filters, occupies less area and is capable of being formed without relying on additional processing steps that increase manufacturing costs.

Figure 6A:
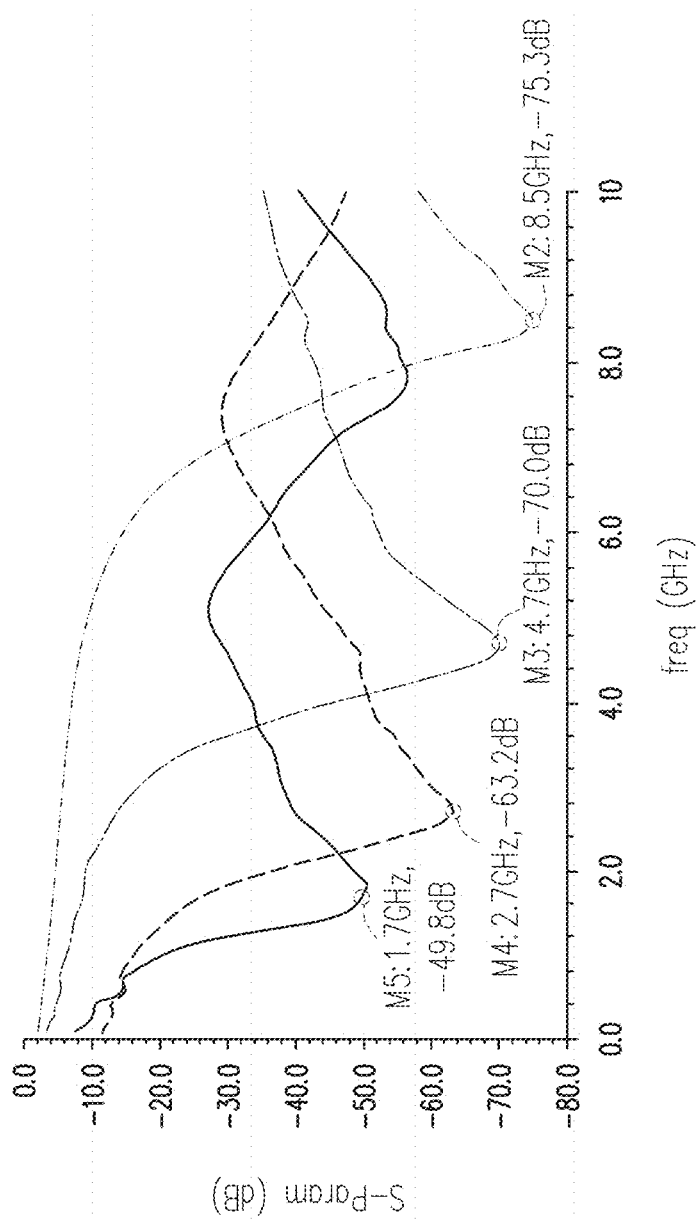
FIGS. 6A-6C are plots of band stop filter structure parameters, in accordance with some embodiments.
Figure 6B:
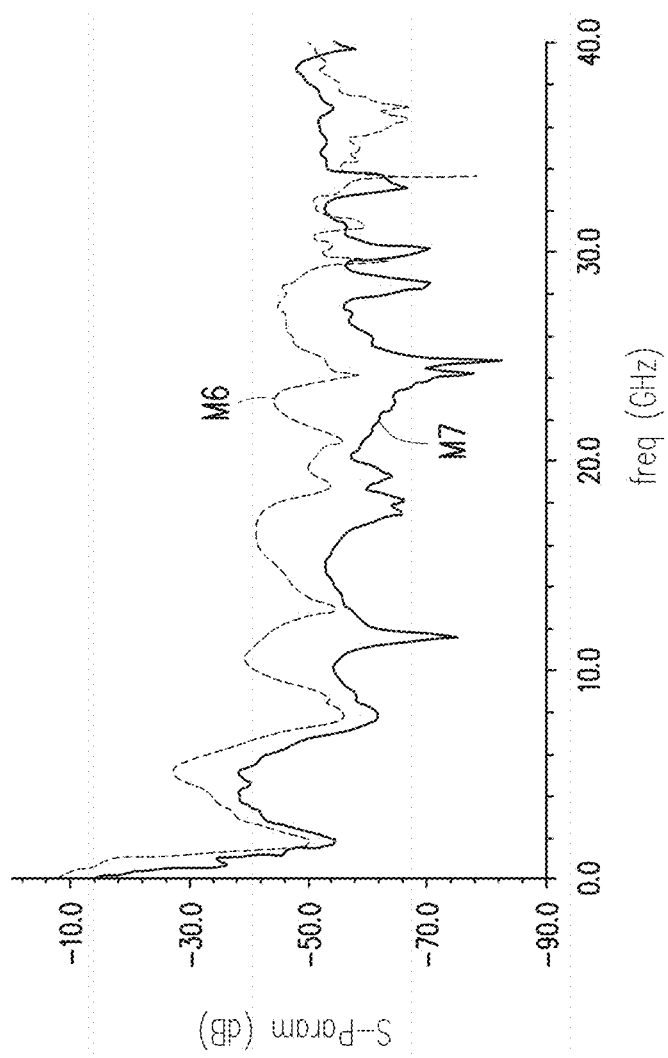
Figure 6C:
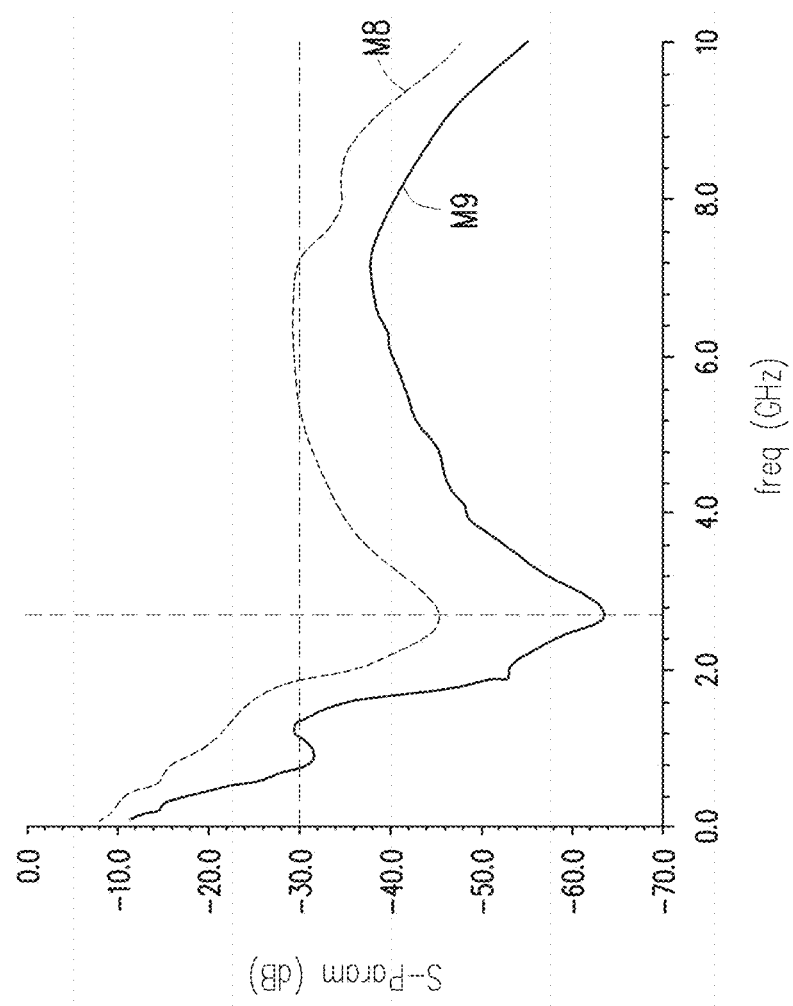

FIGS. 6A-6C are plots of band stop filter structure parameters, in accordance with some embodiments. FIGS. 6A-6C depict non-limiting examples of values of the S21 parameter, also referred to as a transmission coefficient, which indicates the amount of power transmitted by the filter at a given frequency. FIGS. 6A-6C depict the logarithmic expression of the S21 parameter, given by:

$$S21 = 20 \log_{10}(b/a) \quad (1)$$

where a represents input signal magnitude and b represents output signal magnitude.

The non-limiting examples depicted in FIGS. 6A-6C are based on measurements of band stop filter structures 300A-300D, discussed above with respect to FIGS. 3A-3D, including inductive device 500, discussed above with respect to FIG. 5. In each of FIGS. 6A-6C, S21 values are plotted along the y-axis, and frequency is plotted along the x-axis.

In the embodiments depicted in FIGS. 6A-6C, S21 parameter values are equivalent to S12 parameter values (representing the reverse direction transmission coefficient) based on the reciprocal configuration of band stop filter structures 300A-300D including inductive device 500. In some embodiments that do not include a reciprocal configuration, S21 parameter values are not equivalent to S12 parameter values.

FIG. 6A depicts a plot of S21 values for embodiments of band stop filter structure 300A corresponding to 1×4 arrays of square unit cells having varying sizes. Curve M2 depicts S21 values for a 1×4 array of unit cells having length L and height H equal to 300 μm, for which a resonance frequency is 8.5 GHz. Curve M3 depicts S21 values for a 1×4 array of unit cells having length L and height H equal to 400 μm, for which a resonance frequency is 4.7 GHz. Curve M4 depicts S21 values for a 1×4 array of unit cells having length L and height H equal to 500 μm, for which a resonance frequency is 2.7 GHz. Curve M5 depicts S21 values for a 1×4 array of unit cells having length L and height H equal to 600 μm, for which a resonance frequency is 1.7 GHz.

Curves M2-M5 provide a non-limiting example of a relationship between unit cell size to resonance frequency, in which resonance frequency increases as unit cell size decreases.

FIG. 6B depicts a plot of S21 values for embodiments of band stop filter structures 300A and 300B. Curve M6 depicts S21 values for an embodiment of band stop filter structure 300A corresponding to a 1×4 array of square unit cells having length L and height H equal to 600 μm. Curve M7 depicts S21 values for an embodiment of band stop filter structure 300B corresponding to a 1×8 array of square unit cells having length L and height H equal to 600 μm.

Curves M6 and M7 provide a non-limiting example of a relationship between unit cell array size and S21 values in which S21 values are lower for a 1×8 unit cell array than for a 1×4 unit cell array.

FIG. 6C depicts a plot of S21 values for embodiments of band stop filter structures 300C and 300D. Curve M8 depicts S21 values for an embodiment of band stop filter structure 300C corresponding to a 2×3 array of square unit cells having length L and height H equal to 500 μm. Curve M9 depicts S21 values for an embodiment of band stop filter structure 300D corresponding to a 3×3 array of square unit cells having length L and height H equal to 500 μm.

Curves M8 and M9 provide a non-limiting example of a relationship between unit cell array size and S21 values in which S21 values are lower for a 3×3 unit cell array than for a 2×3 unit cell array.

Figure 7:
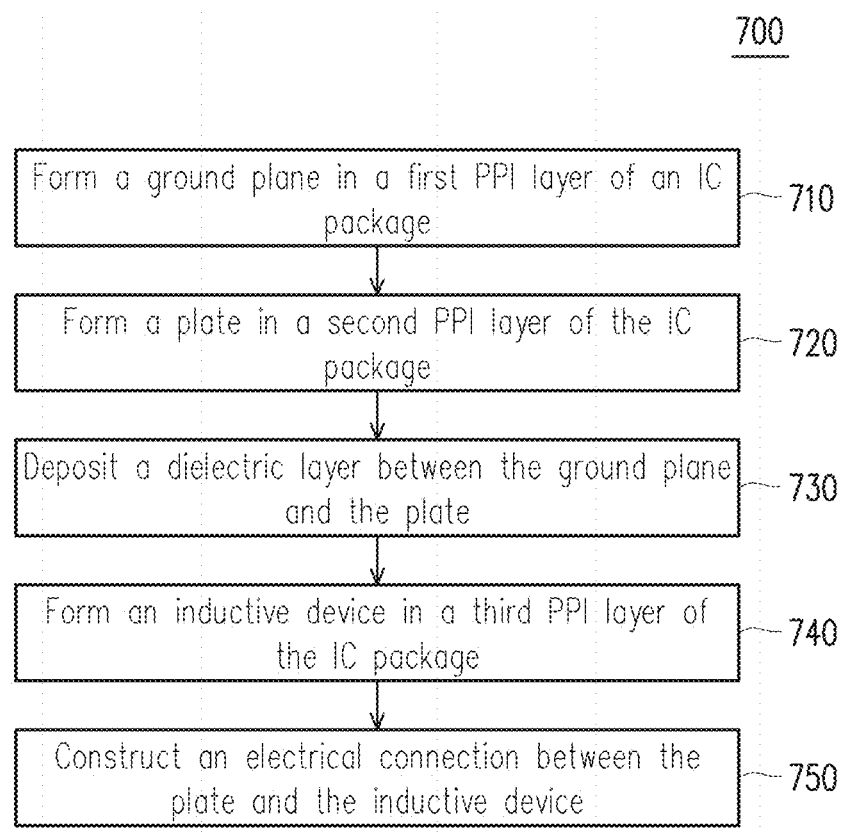
FIG. 7 is a flowchart of a method of forming a band stop filter structure, in accordance with some embodiments.

FIG. 7 is a flowchart of a method 700 of forming a band stop filter structure, in accordance with some embodiments. Method 700 is operable to form any of band stop filter structures 100, 300A-300C, 400A, or 400B, discussed above with respect to FIGS. 1A, 1B, 3A-3C, 4A, and 4B.

In some embodiments, the operations of method 700 are performed in the order depicted in FIG. 7. In some embodiments, the operations of method 700 are performed in an order other than the order depicted in FIG. 7. In some embodiments, one or more additional operations are performed before, during, and/or after the operations of method 700.

In some embodiments, operations of method 700 are a subset of operations of a method of forming an IC package. In some embodiments, the operations of method 700 are a subset of operations of a method of forming a 2.5D IC package. In some embodiments, the operations of method 700 are a subset of operations of a method of forming a 3D IC package. In some embodiments, the operations of method 700 are a subset of operations of a method of forming an InFO package. In some embodiments, the operations of method 700 are a subset of operations of a method of forming IC package 200, discussed above with respect to FIG. 2.

At operation 710, a ground plane is formed in a first PPI layer of an IC package. In some embodiments, forming the ground plane in the first PPI layer of the IC package includes forming the ground plane in IC package 200, discussed above with respect to FIG. 2.

In some embodiments, forming the ground plane in the first PPI layer of the IC package includes forming ground plane 130 in metal layer ML1, discussed above with respect to band stop filter structure 100 and FIGS. 1A and 1B. In some embodiments, forming the ground plane in the first PPI layer of the IC package includes forming ground plane 430A in metal layer ML2, discussed above with respect to band stop filter structure 400A and FIG. 4A. In some embodiments, forming the ground plane in the first PPI layer of the IC package includes forming ground plane 430B in metal layer ML3, discussed above with respect to band stop filter structure 400B and FIG. 4B.

In some embodiments, forming the ground plane in the first PPI layer of the IC package includes forming one ground plane of a plurality of ground planes in the first PPI layer of the IC package.

In some embodiments, forming the ground plane in the first PPI layer of the IC package includes depositing a metal such as copper. In some embodiments, forming the ground plane in the first PPI layer of the IC package includes depositing a seed layer containing copper or a copper alloy. In some embodiments, forming the ground plane in the first PPI layer of the IC package includes forming a diffusion barrier layer containing titanium.

In some embodiments, forming the ground plane in the first PPI layer of the IC package includes depositing one or more materials through a patterned photoresist layer that is then removed. In some embodiments, forming the ground plane in the first PPI layer of the IC package includes performing one or more deposition processes followed by performing one or more etching processes.

In some embodiments, forming the ground plane in the first PPI layer of the IC package includes forming the ground plane to a thickness ranging from 3 µm to 20 µm. In some embodiments, forming the ground plane in the first PPI layer of the IC package includes forming the ground plane to a thickness ranging from 5 µm to 10 µm. Forming the ground plane to the thickness values discussed above enables the ground plane to provide electrical conductivity and to be formed by processes consistent with one or more other IC package formation processes, thereby avoiding additional processes that increase production costs in some instances.

At operation 720, a plate is formed in a second PPI layer of the IC package. In some embodiments, forming the plate in the second PPI layer of the IC package includes forming the plate in IC package 200, discussed above with respect to FIG. 2.

In some embodiments, forming the plate in the second PPI layer of the IC package includes forming one or both of plates 120A or 120B in metal layer ML2, discussed above with respect to band stop filter structure 100 and FIGS. 1A and 1B.

In some embodiments, forming the plate in the second PPI layer of the IC package includes forming plate 420A in metal layer ML1, discussed above with respect to band stop filter structure 400A and FIG. 4A. In some embodiments, forming the plate in the second PPI layer of the IC package includes forming plate 420B1 in metal layer ML4, discussed above with respect to band stop filter structure 400B and FIG. 4B. In some embodiments, forming the plate in the second PPI layer of the IC package includes forming plate 420B2 in metal layer ML2, discussed above with respect to band stop filter structure 400B and FIG. 4B.

In some embodiments, forming the plate in the second PPI layer of the IC package includes forming one plate of a plurality of plates in the second PPI layer of the IC package. In some embodiments, forming the plate in the second PPI layer of the IC package includes forming one plate of a plurality of plates in an array of unit cells of a band stop filter structure. In some embodiments, forming the plate in the second PPI layer of the IC package includes forming one plate of a plurality of plates in an array of unit cells 100A of one of band stop filter structures 300A-300D, discussed above with respect to FIGS. 3A-3D.

In some embodiments, forming the plate in the second PPI layer of the IC package includes depositing a metal such as copper. In some embodiments, forming the plate in the second PPI layer of the IC package includes depositing a seed layer containing copper or a copper alloy. In some embodiments, forming the plate in the second PPI layer of the IC package includes forming a diffusion barrier layer containing titanium.

In some embodiments, forming the plate in the second PPI layer of the IC package includes depositing one or more materials through a patterned photoresist layer that is then removed. In some embodiments, forming the plate in the second PPI layer of the IC package includes performing one or more deposition processes followed by performing one or more etching processes.

In some embodiments, forming the plate in the second PPI layer of the IC package includes forming the plate to a thickness ranging from 3 µm to 20 µm. In some embodiments, forming the plate in the second PPI layer of the IC package includes forming the plate to a thickness ranging from 5 µm to 10 µm. Forming the plate to the thickness values discussed above enables the plate to provide electrical conductivity and to be formed by processes consistent with one or more other IC package formation processes, thereby avoiding additional processes that increase production costs in some instances.

At operation 730, a dielectric layer is deposited between the ground plane and the plate. In some embodiments, depositing the dielectric layer between the ground plane and the plate includes depositing the dielectric layer in IC package 200, discussed above with respect to FIG. 2.

In some embodiments, depositing the dielectric layer between the ground plane and the plate includes depositing dielectric layer DL1, discussed above with respect to band stop filter structure 100 and FIGS. 1A and 1B and with respect to band stop filter structure 400A and FIG. 4A. In some embodiments, depositing the dielectric layer between the ground plane and the plate includes depositing dielectric layer DL3, discussed above with respect to band stop filter structure 400B and FIG. 4B. In some embodiments, depositing the dielectric layer between the ground plane and the plate includes depositing dielectric layer DL2, discussed above with respect to band stop filter structure 400B and FIG. 4B.

In some embodiments, depositing the dielectric layer between the ground plane and the plate includes depositing a polymer or another material suitable for physically and electrically isolating one or more overlying package layers. In some embodiments, depositing the dielectric layer between the ground plane and the plate includes depositing PBO or PI.

In various embodiments, depositing the dielectric layer between the ground plane and the plate includes performing a physical vapor deposition (PVD) or chemical vapor deposition (CVD) process, a laser chemical vapor deposition (LCVD) process, an evaporation process, an electron beam evaporation (E-gun) process, or another suitable deposition process.

In some embodiments, depositing the dielectric layer between the ground plane and the plate includes depositing the dielectric layer to have a thickness ranging from 2 µm to 20 µm. In some embodiments, depositing the dielectric layer between the ground plane and the plate includes depositing the dielectric layer to have a thickness ranging from 4 µm to 10 µm. Depositing the dielectric layer to have a smaller thickness value reduces the ability of the dielectric layer to provide physical and electrical isolation in some instances.

At operation 740, an inductive device is formed in a third PPI layer of the IC package. In some embodiments, forming the inductive device in the third PPI layer of the IC package includes forming the inductive device in IC package 200, discussed above with respect to FIG. 2.

In some embodiments, forming the inductive device in the third PPI layer of the IC package includes forming one or both of inductive devices 110A or 110B in metal layer ML3, discussed above with respect to band stop filter structure 100 and FIGS. 1A and 1B.

In some embodiments, forming the inductive device in the third PPI layer of the IC package includes forming inductive device 410A in metal layer ML3, discussed above with respect to band stop filter structure 400A and FIG. 4A. In some embodiments, forming the inductive device in the third PPI layer of the IC package includes forming inductive device 410B1 in metal layer ML5, discussed above with respect to band stop filter structure 400B and FIG. 4B. In some embodiments, forming the inductive device in the third PPI layer of the IC package includes forming inductive device 410B2 in metal layer ML1, discussed above with respect to band stop filter structure 400B and FIG. 4B. In some embodiments, forming the inductive device in the third PPI layer of the IC package includes forming inductive device 500, discussed above with respect to FIG. 5.

In some embodiments, forming the inductive device in the third PPI layer of the IC package includes forming one inductive device of a plurality of inductive devices in the third PPI layer of the IC package. In some embodiments, forming the inductive device in the third PPI layer of the IC package includes forming one inductive device of a plurality of inductive devices in an array of unit cells of a band stop filter structure. In some embodiments, forming the inductive device in the third PPI layer of the IC package includes forming one inductive device of a plurality of inductive devices in an array of unit cells 100A of one of band stop filter structures 300A-300D, discussed above with respect to FIGS. 3A-3D.

In some embodiments, forming the inductive device in the third PPI layer of the IC package includes depositing a metal such as copper. In some embodiments, forming the inductive device in the third PPI layer of the IC package includes depositing a seed layer containing copper or a copper alloy. In some embodiments, forming the inductive device in the third PPI layer of the IC package includes forming a diffusion barrier layer containing titanium.

In some embodiments, forming the inductive device in the third PPI layer of the IC package includes depositing one or more materials through a patterned photoresist layer that is then removed. In some embodiments, forming the inductive device in the third PPI layer of the IC package includes performing one or more deposition processes followed by performing one or more etching processes.

In some embodiments, forming the inductive device in the third PPI layer of the IC package includes forming the inductive device to a thickness ranging from 3 μm to 20 μm. In some embodiments, forming the inductive device in the third PPI layer of the IC package includes forming the inductive device to a thickness ranging from 5 μm to 10 μm. Forming the inductive device to the thickness values discussed above enables the inductive device to provide electrical conductivity and to be formed by processes consistent with one or more other IC package formation processes, thereby avoiding additional processes that increase production costs in some instances.

At operation 750, an electrical connection is constructed between the plate and the inductive device. In some embodiments, constructing the electrical connection between the plate and the inductive device includes constructing the electrical connection in IC package 200, discussed above with respect to FIG. 2.

In some embodiments, constructing the electrical connection between the plate and the inductive device includes constructing a via between the second PPI layer and the third PPI layer. In some embodiments, constructing the electrical connection between the plate and the inductive device includes constructing one or both of vias 115A or 115B in dielectric layer DL2, discussed above with respect to band stop filter structure 100 and FIGS. 1A and 1B.

In some embodiments, constructing the electrical connection between the plate and the inductive device includes constructing conductive element 415A in dielectric layers DL1 and DL2 and in metal layer ML2, discussed above with respect to band stop filter structure 400A and FIG. 4A. In some embodiments, constructing the electrical connection between the plate and the inductive device includes constructing conductive element 415B1 in dielectric layer DL4, discussed above with respect to band stop filter structure 400B and FIG. 4B. In some embodiments, constructing the electrical connection between the plate and the inductive device includes constructing conductive element 415B2 in dielectric layer DL1, discussed above with respect to band stop filter structure 400B and FIG. 4B.

In some embodiments, constructing the electrical connection between the plate and the inductive device includes constructing one electrical connection of a plurality of electrical connections between a corresponding plurality of plates and a corresponding plurality of inductive devices. In some embodiments, constructing the electrical connection between the plate and the inductive device includes constructing one electrical connection of a plurality of electrical connections in an array of unit cells of a band stop filter structure. In some embodiments, constructing the electrical connection between the plate and the inductive device includes constructing one electrical connection of a plurality of electrical connections in an array of unit cells 100A of one of band stop filter structures 300A-300D, discussed above with respect to FIGS. 3A-3D.

In some embodiments, constructing the electrical connection between the plate and the inductive device includes depositing copper. In some embodiments, constructing the electrical connection between the plate and the inductive device includes depositing a seed layer containing copper or a copper alloy. In some embodiments, constructing the electrical connection between the plate and the inductive device includes depositing a diffusion barrier layer containing titanium.

In some embodiments, performing operations 720 and 740 includes forming a perimeter of the plate and a perimeter of the inductive device aligned in a direction perpendicular to a plane of the ground plane. In some embodiments, performing operations 720 and 740 includes forming one or both of perimeters 110AP or 110BP aligned with corresponding one or both of perimeters 120AP or 120BP in the Z direction, discussed above with respect to band stop filter structure 100 and FIGS. 1A and 1B.

The operations of method 700 are capable of being performed as part of a method of forming an IC package and are usable to form a band stop filter structure that includes at least one L/C circuit, thereby obtaining the benefits discussed above with respect to band stop filter structures 100, 300A-300D, 400A, and 400B.

Figure 8:
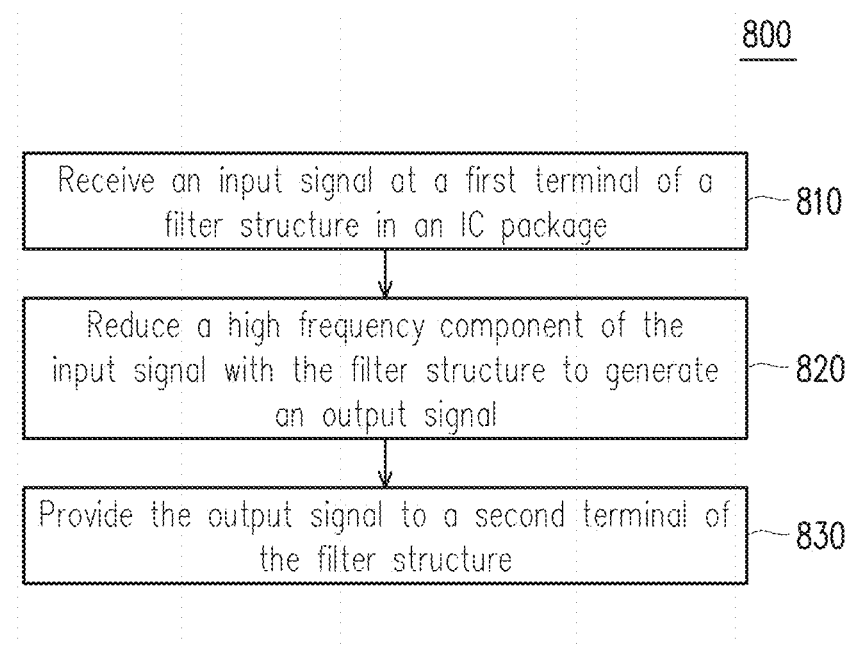
FIG. 8 is a flowchart of a method of filtering a signal, in accordance with some embodiments.

FIG. 8 a flowchart of a method 800 of filtering a signal, in accordance with some embodiments. Method 800 is usable with a band stop filter structure, e.g., band stop filter structure 100 (FIGS. 1A and 1B), band stop filter structures 300A-300D (FIGS. 3A-3D), or band stop filter structures 400A and 400B (FIGS. 4A and 4B), or with an IC package, e.g., IC package 200, discussed above with respect to FIG. 2.

At operation 810, an input signal is received at a first terminal of a filter structure in an IC package. The input signal includes a low frequency component and a high frequency component.

In some embodiments, the low frequency component includes a substantially DC signal. In some embodiments, the low frequency component includes an AC signal having one or more frequency components below a predetermined frequency. In some embodiments, the predetermined frequency defining the low frequency component has a value ranging from 100 hertz (Hz) to 100 megahertz (MHz). In some embodiments, the predetermined frequency defining the low frequency component has a value ranging from 1000 Hz to 100 kilohertz (kHz).

The high frequency component is an AC signal including one or more high frequency components above a predetermined frequency. In some embodiments, the predetermined frequency defining the high frequency component has a value ranging from 100 MHz to 100 GHz. In some embodiments, the predetermined frequency defining the high frequency component has a value ranging from 1 GHz to 10 GHz.

In some embodiments, the low frequency component is a power component and/or the high frequency component is a noise component, as discussed above with respect to band stop filter structure 100 and FIGS. 1A and 1B.

In some embodiments, receiving the input signal at the first terminal of the filter structure includes receiving the input signal within IC package 200, discussed above with respect to FIG. 2. In some embodiments, receiving the input signal at the first terminal of the filter structure includes receiving the input signal at terminal 110A1 of inductive device 110A, discussed above with respect to band stop filter structure 100 and FIGS. 1A and 1B. In some embodiments, receiving the input signal at the first terminal of the filter structure includes receiving the input signal at terminal 110B1 of inductive device 110B, discussed above with respect to band stop filter structure 100 and FIGS. 1A and 1B.

In some embodiments, receiving the input signal at the first terminal of the filter structure includes receiving the input signal at terminal 300A1 of band stop filter structure 300A, discussed above with respect to FIG. 3A. In some embodiments, receiving the input signal at the first terminal of the filter structure includes receiving the input signal at terminal 300B1 of band stop filter structure 300B, discussed above with respect to FIG. 3B. In some embodiments, receiving the input signal at the first terminal of the filter structure includes receiving the input signal at terminal 300C1 of band stop filter structure 300C, discussed above with respect to FIG. 3C. In some embodiments, receiving the input signal at the first terminal of the filter structure includes receiving the input signal at terminal 300D1 of band stop filter structure 300D, discussed above with respect to FIG. 3D.

In some embodiments, receiving the input signal at the first terminal of the filter structure includes receiving the input signal at inductive device 410A, discussed above with respect to band stop filter structure 400A and FIG. 4A. In some embodiments, receiving the input signal at the first terminal of the filter structure includes receiving the input signal at inductive device 410B1, discussed above with respect to band stop filter structure 400B and FIG. 4B. In some embodiments, receiving the input signal at the first terminal of the filter structure includes receiving the input signal at inductive device 410B2, discussed above with respect to band stop filter structure 400B and FIG. 4B. In some embodiments, receiving the input signal at the first terminal of the filter structure includes receiving the input signal at terminal 500T1 of inductive device 500, discussed above with respect to FIG. 5.

At operation 820, the high frequency component of the input signal is reduced using the filter structure to generate an output signal. In some embodiments, reducing the high frequency component of the input signal includes reducing a noise component, as discussed above with respect to band stop filter structure 100 and FIGS. 1A and 1B.

Reducing the high frequency component of the input signal using the filter structure includes using the filter structure including an inductive device and a capacitive device. The inductive device is located in a first metal layer of the IC package and the capacitive device is electrically connected to the inductive device. The capacitive device includes a first metal plate in a second metal layer of the IC package and a second metal plate in a third metal layer of the IC package.

In some embodiments, the inductive device and the capacitive device are located within IC package 200, and reducing the high frequency component of the input signal includes reducing the high frequency component of the input signal within IC package 200, discussed above with respect to FIG. 2.

In some embodiments, reducing the high frequency component of the input signal includes using one or both of unit cells 100A or 100B, discussed above with respect to band stop filter structure 100 and FIGS. 1A and 1B.

In some embodiments, reducing the high frequency component of the input signal includes using one of band stop filter structures 300A-300D, discussed above with respect to FIGS. 3A-3D.

In some embodiments, reducing the high frequency component of the input signal includes using inductive device 110A, discussed above with respect to band stop filter structure 100 and FIGS. 1A and 1B. In some embodiments, reducing the high frequency component of the input signal includes using inductive device 110B, discussed above with respect to band stop filter structure 100 and FIGS. 1A and 1B.

In some embodiments, reducing the high frequency component of the input signal includes using inductive device 410A, discussed above with respect to band stop filter structure 400A and FIG. 4A. In some embodiments, reducing the high frequency component of the input signal includes using inductive device 410B1, discussed above with respect to band stop filter structure 400B and FIG. 4B. In some embodiments, reducing the high frequency component of the input signal includes using inductive device 410B2, discussed above with respect to band stop filter structure 400B and FIG. 4B. In some embodiments, reducing the high frequency component of the input signal includes using inductive device 500, discussed above with respect to FIG. 5.

In some embodiments, reducing the high frequency component of the input signal includes using one or both of capacitive devices 140A or 140B, discussed above with respect to band stop filter structure 100 and FIGS. 1A and 1B.

In some embodiments, the capacitive device including the first plate in the second metal layer of the IC package includes one or both of capacitive devices 140A or 140B including ground plane 130, discussed above with respect to band stop filter structure 100 and FIGS. 1A and 1B. In some embodiments, the capacitive device including the second plate in the third metal layer of the IC package includes capacitive device 140A including plate 120A, discussed above with respect to band stop filter structure 100 and FIGS. 1A and 1B. In some embodiments, the capacitive device including the second plate in the third metal layer of the IC package includes capacitive device 140B including plate 120B, discussed above with respect to band stop filter structure 100 and FIGS. 1A and 1B. In some embodiments, the capacitive device including the first plate in the second metal layer of the IC package includes the capacitive device including plate 420A, discussed above with respect to band stop filter structure 400A and FIG. 4A. In some embodiments, the capacitive device including the first plate in the second metal layer of the IC package includes the capacitive device including plate 420B1, discussed above with respect to band stop filter structure 400B and FIG. 4B. In some embodiments, the capacitive device including the first plate in the second metal layer of the IC package includes the capacitive device including plate 420B2, discussed above with respect to band stop filter structure 400B and FIG. 4B.

In some embodiments, the filter structure includes another inductive device in the first metal layer electrically connected to another capacitive device including the first plate and a third plate in the third metal layer of the IC package.

In some embodiments, the filter structure including another inductive device includes the filter structure including inductive device 110B, discussed above with respect to band stop filter structure 100 and FIGS. 1A and 1B. In some embodiments, the filter structure including another inductive device includes the filter structure including inductive device 410A, discussed above with respect to band stop filter structure 400A and FIG. 4A. In some embodiments, the filter structure including another inductive device includes the filter structure including one of inductive devices 410B1 or 410B2, discussed above with respect to band stop filter structure 400B and FIG. 4B. In some embodiments, the filter structure including another inductive device includes the filter structure including inductive device 500, discussed above with respect to FIG. 5.

In some embodiments, the filter structure including another capacitive device includes the filter structure including capacitive device 140B, discussed above with respect to band stop filter structure 100 and FIGS. 1A and 1B. In some embodiments, the another capacitive device including the third plate in the third metal layer of the IC package includes capacitive device 140B including plate 120B, discussed above with respect to band stop filter structure 100 and FIGS. 1A and 1B.

In some embodiments, the another capacitive device including the third plate in the third metal layer of the IC package includes the capacitive device including plate 420A, discussed above with respect to band stop filter structure 400A and FIG. 4A. In some embodiments, the another capacitive device including the third plate in the third metal layer of the IC package includes the capacitive device including one of plates 420B1 or 420B2, discussed above with respect to band stop filter structure 400B and FIG. 4B.

In some embodiments, the filter structure including an inductive device and a capacitive device includes the filter structure including a first unit cell 100A, and the filter structure including another inductive device and another capacitive device includes the filter structure including a second unit cell 100A, discussed above with respect to band stop filter structures 300A-300D and FIGS. 3A-3D.

In some embodiments, reducing the high frequency component of the input signal includes transmitting a remaining portion of the high frequency component corresponding to a transmission coefficient. In some embodiments, reducing the high frequency component of the input signal includes transmitting the remaining portion of the high frequency component corresponding to transmission coefficients M2-M9, discussed above with respect to FIGS. 6A-6C.

In some embodiments, reducing the high frequency component of the input signal includes reducing the high frequency component based on a predetermined resonance frequency corresponding to a size of the inductive device and a size of the capacitive device. In some embodiments, the predetermined resonance frequency is greater than 1 GHz.

At operation 830, the output signal is provided at a second terminal of the filter structure. In some embodiments, providing the output signal at the second terminal of the filter structure includes providing the output signal within IC package 200, discussed above with respect to FIG. 2.

In some embodiments, providing the output signal at the second terminal of the filter structure includes providing the output signal at terminal 110A2 of inductive device 110A, discussed above with respect to band stop filter structure 100 and FIGS. 1A and 1B. In some embodiments, providing the output signal at the second terminal of the filter structure includes providing the output signal at terminal 110B2 of inductive device 110B, discussed above with respect to band stop filter structure 100 and FIGS. 1A and 1B.

In some embodiments, providing the output signal at the second terminal of the filter structure includes providing the output signal at terminal 300A2 of band stop filter structure 300A, discussed above with respect to FIG. 3A. In some embodiments, providing the output signal at the second terminal of the filter structure includes providing the output signal at terminal 300B2 of band stop filter structure 300B, discussed above with respect to FIG. 3B. In some embodiments, providing the output signal at the second terminal of the filter structure includes providing the output signal at terminal 300C2 of band stop filter structure 300C, discussed above with respect to FIG. 3C. In some embodiments, providing the output signal at the second terminal of the filter structure includes providing the output signal at terminal 300D2 of band stop filter structure 300D, discussed above with respect to FIG. 3D.

In some embodiments, providing the output signal at the second terminal of the filter structure includes providing the output signal at inductive device 410A, discussed above with respect to band stop filter structure 400A and FIG. 4A. In some embodiments, providing the output signal at the second terminal of the filter structure includes providing the output signal at inductive device 410B1, discussed above with respect to band stop filter structure 400B and FIG. 4B. In some embodiments, providing the output signal at the second terminal of the filter structure includes providing the output signal at inductive device 410B2, discussed above with respect to band stop filter structure 400B and FIG. 4B. In some embodiments, providing the output signal at the second terminal of the filter structure includes providing the output signal at terminal 500T2 of inductive device 500, discussed above with respect to FIG. 5

By performing operations of method 800, a signal has a high frequency component reduced between a first terminal and a second terminal of a filter structure in an IC package, the signal therefore being communicated in accordance with the benefits discussed above with respect to band stop filter structures 100, 300A-300D, 400A, and 400B.

In some embodiments, a filter structure includes a capacitive device including a ground plane in a first metal layer of an IC package, a plate in a second metal layer of the IC package, and a dielectric layer between the ground plane and the plate, and an inductive device including first and second conductive paths in a third metal layer of the IC package. Each of the first and second conductive paths is electrically connected to the plate and has a width w, the first and second conductive paths are separated by a spacing s, and a ratio s/w has a value ranging from 1 to 2. In some embodiments, each of the first and second conductive paths is electrically connected to the plate through a single via extending between the second and third metal layers of the IC package. In some embodiments, the via extends through an opening in the ground plane. In some embodiments, the capacitive device is a first capacitive device, the inductive device is a first inductive device, and the filter structure further includes a second capacitive device including the ground plane, another plate in a fourth metal layer of the IC package, and another dielectric layer between the ground plane and the another plate, and a second inductive device comprising third and fourth conductive paths in a fifth metal layer of the IC package, wherein the ground plane is positioned between the first inductive device and the second inductive device. In some embodiments, each of the first and second conductive paths includes a plurality of vertical segments and a plurality of horizontal segments. In some embodiments, the plate has a length L and a height H, and a ratio L/H has a value ranging from 0.9 to 1.1. In some embodiments, the dielectric layer includes PBO and/or PI. In some embodiments, each of the first and second conductive paths is part of a first power distribution path of the IC package, and the ground plane is part of a second power distribution path of the IC package.

In some embodiments, a filter structure includes a ground plane in a first metal layer of an IC package, a dielectric layer adjacent to the ground plane, a first capacitive device including the ground plane, the dielectric layer, and a first plate in a second metal layer of the IC package, a second capacitive device including the ground plane, the dielectric layer, and a second plate in the second metal layer, a first inductive device including first and second conductive paths in a third metal layer of the IC package, and a second inductive device including third and fourth conductive paths in the third metal layer. Each of the first and second conductive paths is electrically connected to the first plate and has a width w, each of the third and fourth conductive paths is electrically connected to the second plate and has the width w, the first and second conductive paths are separated by a spacing s, the third and fourth conductive paths are separated by the spacing s, and a ratio s/w has a value ranging from 1 to 2. In some embodiments, the first and second plates are separated by a distance corresponding to a minimum spacing rule of the second metal layer of the IC package. In some embodiments, each of the first and second plates has a length L and a height H, and a ratio L/H has a value ranging from 0.9 to 1.1. In some embodiments, the filter structure includes a row of unit cells configured in series, a first unit cell of the row of unit cells includes the first capacitive device and the first inductive device, and a second unit cell of the row of unit cells includes the second capacitive device and the second inductive device. In some embodiments, the row of unit cells is a first row of unit cells, and the filter structure includes a second row of unit cells configured in parallel with the first row of unit cells. In some embodiments, each of the first through fourth conductive paths is part of a first power distribution path of the IC package, the ground plane is part of a second power distribution path of the IC package, and the dielectric layer includes PBO and/or PI.

In some embodiments, a method of forming a filter structure includes constructing a capacitive device by forming a ground plane in a first PPI layer of an IC package, forming a plate in a second PPI layer of the IC package, and depositing a dielectric layer between the ground plane and the plate, constructing a via between the plate and a third PPI layer of the IC package, and forming an inductive device in the third PPI layer of the IC package by electrically connecting first and second conductive paths to the via, each of the first and second conductive paths having a width w, and separating the first and second conductive paths by a spacing s, wherein a ratio s/w has a value ranging from 1 to 2. In some embodiments, electrically connecting the first and second conductive paths to the via includes forming a plurality of vertical segments and a plurality of horizontal segments. In some embodiments, forming the inductive device in the third PPI layer includes the second PPI layer being between the first and third PPI layers. In some embodiments, forming the plate includes forming the plate having a length L and a height H, and a ratio L/H has a value ranging from 0.9 to 1.1. In some embodiments, depositing the dielectric layer between the ground plane and the plate includes depositing PBO and/or PI. In some embodiments, forming the ground plane in the first PPI layer is part of forming a first power distribution path of the IC package, and forming the inductive device in the third PPI layer is part of forming a second power distribution path of the IC package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A filter structure comprising:
  a capacitive device comprising:
    a ground plane in a first metal layer of an integrated circuit (IC) package;
    a plate in a second metal layer of the IC package; and
    a dielectric layer between the ground plane and the plate; and
  an inductive device comprising first and second conductive paths in a third metal layer of the IC package,
  wherein
    each of the first and second conductive paths is electrically connected to the plate has a width w, and comprises a plurality of vertical segments and a plurality of horizontal segments,
    the first and second conductive paths are separated by a spacing s, and
    a ratio s/w has a value ranging from 1 to 2.

2. The filter structure of claim 1, wherein each of the first and second conductive paths is electrically connected to the plate through a single via extending between the second and third metal layers of the IC package.

3. The filter structure of claim 2, wherein the single via extends through an opening in the ground plane.

4. The filter structure of claim 1, wherein
  the capacitive device is a first capacitive device,
  the inductive device is a first inductive device, and
  the filter structure further comprises:
    a second capacitive device comprising:
      the ground plane;
      another plate in a fourth metal layer of the IC package; and
      another dielectric layer between the ground plane and the another plate; and a second inductive device comprising third and fourth conductive paths in a fifth metal layer of the IC package,
wherein the ground plane is positioned between the first inductive device and the second inductive device.

5. The filter structure of claim 1, wherein the plurality of vertical segments and the plurality of horizontal segments of the first conductive path are rotationally symmetrical to the plurality of vertical segments and the plurality of horizontal segments of the second conductive path.

6. The filter structure of claim 1, wherein
the plate has a length L and a height H, and
a ratio L/H has a value ranging from 0.9 to 1.1.

7. The filter structure of claim 1, wherein the dielectric layer comprises polybenzoxazole (PBO) and/or polyimide (PI).

8. The filter structure of claim 1, wherein
each of the first and second conductive paths is part of a first power distribution path of the IC package, and
the ground plane is part of a second power distribution path of the IC package.

9. A filter structure comprising:
a ground plane in a first metal layer of an integrated circuit (IC) package;
a dielectric layer adjacent to the ground plane;
a first capacitive device comprising the ground plane, the dielectric layer, and a first plate in a second metal layer of the IC package;
a second capacitive device comprising the ground plane, the dielectric layer, and a second plate in the second metal layer;
a first inductive device comprising first and second conductive paths in a third metal layer of the IC package; and
a second inductive device comprising third and fourth conductive paths in the third metal layer,
wherein
each of the first and second conductive paths is electrically connected to the first plate and has a width w,
each of the third and fourth conductive paths is electrically connected to the second plate and has the width w,
the first and second conductive paths are separated by a spacing s,
the third and fourth conductive paths are separated by the spacing s, and
a ratio s/w has a value ranging from 1 to 2.

10. The filter structure of claim 9, wherein the first and second plates are separated by a distance corresponding to a minimum spacing rule of the second metal layer of the IC package.

11. The filter structure of claim 9, wherein
each of the first and second plates has a length L and a height H, and
a ratio L/H has a value ranging from 0.9 to 1.1.

12. The filter structure of claim 9, wherein
the filter structure comprises a row of unit cells configured in series,
a first unit cell of the row of unit cells comprises the first capacitive device and the first inductive device, and
a second unit cell of the row of unit cells comprises the second capacitive device and the second inductive device.

13. The filter structure of claim 12, wherein
the row of unit cells is a first row of unit cells, and
the filter structure comprises a second row of unit cells configured in parallel with the first row of unit cells.

14. The filter structure of claim 9, wherein
each of the first through fourth conductive paths is part of a first power distribution path of the IC package,
the ground plane is part of a second power distribution path of the IC package, and
the dielectric layer comprises polybenzoxazole (PBO) and/or polyimide (PI).

15. A method of forming a filter structure, the method comprising:
constructing a capacitive device by:
forming a ground plane in a first post-passivation interconnect (PPI) layer of an integrated circuit (IC) package;
forming a plate in a second PPI layer of the IC package, wherein the forming the plate comprises forming the plate having a length L and a height H and a ratio L/H has a value ranging from 0.9 to 1.1; and
depositing a dielectric layer between the ground plane and the plate;
constructing a via between the plate and a third PPI layer of the IC package; and
forming an inductive device in the third PPI layer of the IC package by:
electrically connecting first and second conductive paths to the via, each of the first and second conductive paths having a width w, and
separating the first and second conductive paths by a spacing s, wherein a ratio s/w has a value ranging from 1 to 2.

16. The method of claim 15, wherein the electrically connecting the first and second conductive paths to the via comprises forming a plurality of vertical segments and a plurality of horizontal segments.

17. The method of claim 15, wherein the forming the inductive device in the third PPI layer comprises the second PPI layer being between the first and third PPI layers.

18. The method of claim 15, wherein the forming the plate comprises one or both of length L or height H having a value ranging from 100 micrometers (μm) to 1000 μm.

19. The method of claim 15, wherein the depositing the dielectric layer between the ground plane and the plate comprises depositing polybenzoxazole (PBO) and/or polyimide (PI).

20. The method of claim 15, wherein
the forming the ground plane in the first PPI layer is part of forming a first power distribution path of the IC package, and
the forming the inductive device in the third PPI layer is part of forming a second power distribution path of the IC package.

* * * * *